Oct. 6, 1964 J. O. GRIGGS, JR 3,151,545

REGENERATIVE PULSE SWITCHING AND CURRENT DRIVER CIRCUIT

Filed Nov. 1, 1962 3 Sheets-Sheet 1

INVENTOR.
JOHN O. GRIGGS JR.
BY J. P. Santo
ATTORNEY.

INVENTOR.
JOHN O. GRIGGS JR.
BY J P Santo
ATTORNEY.

Oct. 6, 1964 J. O. GRIGGS, JR 3,151,545

REGENERATIVE PULSE SWITCHING AND CURRENT DRIVER CIRCUIT

Filed Nov. 1, 1962 3 Sheets-Sheet 3

INVENTOR
JOHN O. GRIGGS JR.
BY J P Santo
ATTORNEY.

3,151,545

REGENERATIVE PULSE SWITCHING AND CURRENT DRIVER CIRCUIT

John O. Griggs, Jr., Plymouth, Mich., assignor to Burroughs Corporation, Detroit, Mich., a corporation of Michigan Filed Nov. 1, 1962, Ser. No. 234,819
14 Claims. (Cl. 101—93)

This invention relates to pulse switching and driver circuits, and, more particularly, to a regenerative pulse switching and current driver circuit utilizing transistor switching devices.

The invention is specially suited for use as a pulse switching and current driver circuit for a printing device or apparatus having differentially positionable and arrestable printing elements and electrical contact read-out switches positioned by the printing elements, and serves to amplify low level signal pulses supplied to the circuit to control a print element solenoid of the printer apparatus to arrest the movement of a printing element and subsequently to pulse the contacts of the read-out switch with a high level, high energy output pulse using the energy stored in the solenoid for contact wetting purposes.

The invention has for an object to provide a dual operating mode pulse switching and current driver circuit for controlling apparatus of the above character.

Another object is to provide a dual operating mode pulse switching and current driver circuit operating as a bistable binary switching device in one mode of operation and as a fast switching current driver circuit of high power handling capacity in its other mode.

Still another object is to provide a transistorized circuit in accordance with the aforementioned objects utilizing a minimum number of elements.

In accordance with the invention and toward the accomplishment of the aforementioned objects there is provided a cascaded pair of direct coupled alternately conducting transistor devices of similar conductivity type having a selectively enabled regenerative feedback circuit that aids in switching an inductive load connected in the output of the second transistor under the application of a signal input pulse forward biasing the first transistor and that maintains the switched condition of the load after the disappearance of the signal input pulse, and means for disabling the feedback circuit thereafter to reset the transistors to their original condition in order to charge and utilize the inductive surge energy of the load released under the subsequent application of another signal input pulse forward biasing the first transistor.

A more complete understanding of the invention may be obtained from the following detailed description and drawings, in which.

Figure 1:
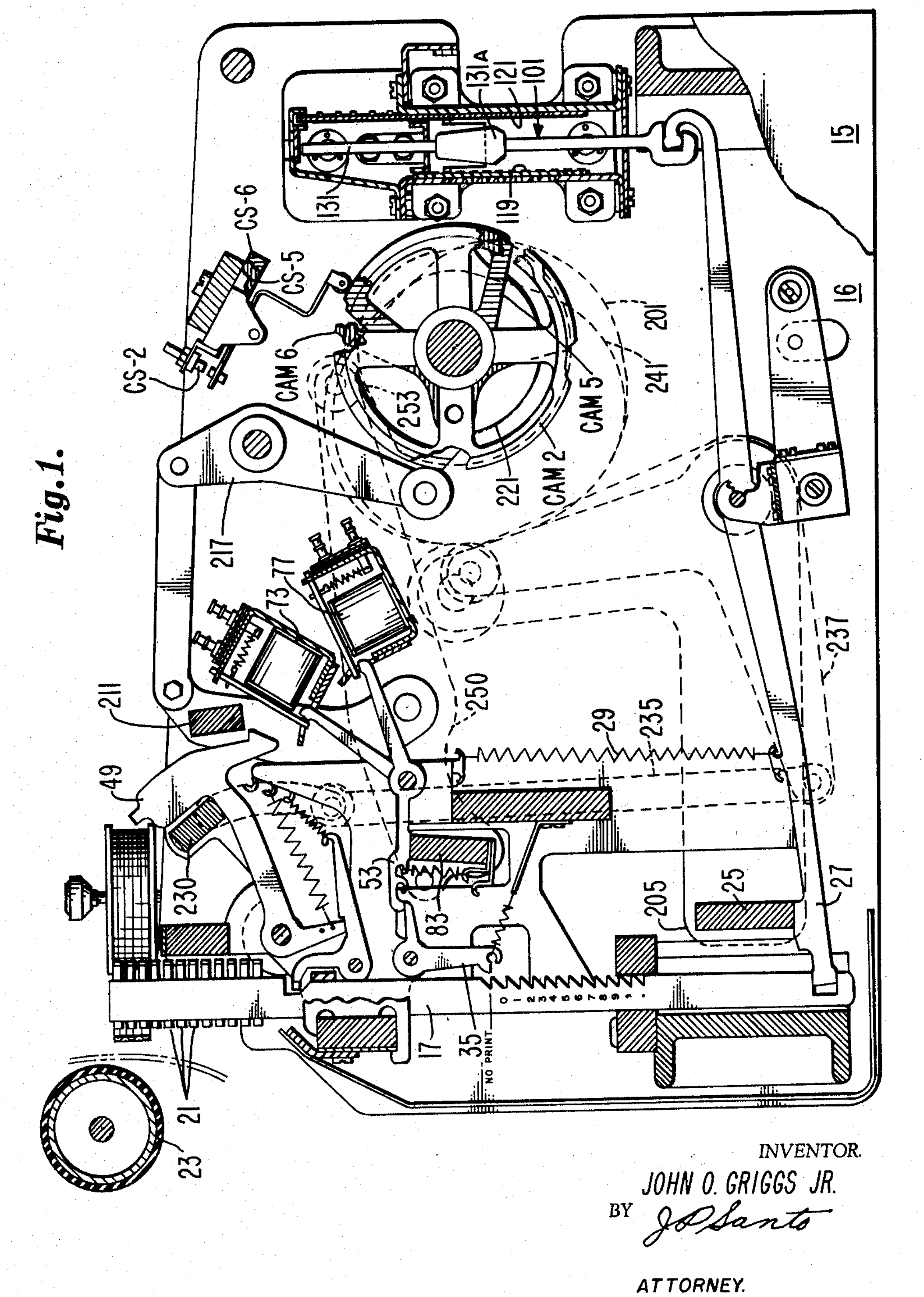
FIG. 1 is a right side elevation view in section and with parts broken away of a printer device controlled by the circuit of the present invention.

Referring to the drawings, the cyclically operable printing device illustrated in FIG. 1 and for which the present improved circuit was designed will be recognized as the multi-column, rack type, full line gang printer shown and described in copending U.S. patent application S.N. 17,200, filed March 23, 1960, now U.S. Patent 3,062,134, of common ownership herewith and to which reference is made for a detailed description of the construction and operation thereof. Briefly described for purposes of understanding its main mechanical and functional operating relationships to the circuit of the present invention, the printer includes a pair of side frames 15, 16 between which are mounted a plurality of differentially positionable type bars, as 17, carrying type elements 21 and cooperating with a printing hammer 49 to make a printing impression through an inked ribbon on a record medium carried on a platen 23 when the type bar has been selectively arrested and positioned with one of the type elements in the path of the hammer provided for each type bar.

Journalled in the side frames is a main cam shaft 200 which is driven by an electric motor through a one-revolution clutch, both not shown, for powering the printer mechanism. Outer cams, as 201, move a restoring bail 25 extending between and through the side frames to a pair of outer bell cranks, as 205 to permit movement of inner bell cranks, as 27, upwardly under the urge of springs 29, thereby to raise an associated type bar coupled to one end of the crank 27, and later to restore the type bar to its lowered position through the contacting restoring bail 25. The other end of the crank 27, one of which is provided for each type bar, is coupled to a reciprocable actuator arm 131 of the movable contact read-out switch assembly 101, there being a separate read-out switch for each type bar.

Movement of the type bar is arrested through the operation of a drop-out solenoid 73, one of which is provided for each type bar, having a clapper 77 for rocking one end of a rocker arm 53. The other end or arm of 53 is downwardly biased to contact one end of a spring retracted stop pawl 35 that is adapted to be received in one of a plurality of saw-tooth shaped notches 33, each corresponding to a different one of the printing positions and type elements, provided on the type bar. The operation of the solenoid for arresting a type bar and deriving a steep, high voltage, high energy pulse for pulsing of the contacts of a read-out switch is controlled by the pulse switching and driver circuit of FIG. 2, one of which is provided for the solenoid of each type bar and which includes several timing cam operated switches, CS–2, CS–5 and CS–6 controlled from the corresponding cams mounted on the cam shaft 200 of the cyclically operable printer. The cam operated switches are shown in FIG. 1 mounted above their correspondingly designated cams, Cam 2, Cam 5 and Cam 6, carried on the cam shaft.

With the contacts of CS–5 and CS–6 open, no current flows to the solenoid. As the cams begin to rotate, contacts CS–6 close at about 9 degrees of the printer cycle and electric current is supplied to the solenoid from the control circuitry. The solenoid clapper 77 pulls in holding the type bar stop pawl 35 out of engagement with the notches 33 of the type bar through the solenoid rocker arm 53. With further movement of the cam shaft, Cam 5 contacts CS–5 close at about 26 degrees of the printer cycle, conditioning the control circuit for operation as a binary switch or flip flop. At this time, hammer firing bail 211 has moved over to latch the type hammers 49, hammer restoring bail 230 has moved out of the path of the hammer, and rocker arm restoring bail 83 has moved out of the way of the rocker arm 53. All of the above movements are provided by cams 221, 241 and 253 through their associated follower levers 217, 237, and 250, respectively.

With contacts CS–5 closed, pulses from a decoder, processing unit or pulsing device can be received by the solenoid control circuitry. At this time cam 201 begins to allow bail 25 to raise and the type bars are moved upward by their respective rocker arms 27. As the bar is raised, an information signal or pulse from the processor or signal source triggers the control circuit associated with each solenoid and interrupts the current to the solenoid. Clapper 77 drops out allowing solenoid rocker arm to move the stop pawl 35 into engagement with the appropriate notch 33 and stop the type bar with the selected type element in printing position.

Simultaneously with the movement of the type bar, a counter movement is imparted through arm 27 to the movable contact carrying arm 131 of the read-out switch corresponding to the type bar and positions contact carrier 131A between circuit boards 119 and 121. Circuit board 119 has a plurality of horizontal contact strips corresponding in number to the type elements 21, while circuit board 121 has a vertical strip that remains in contact with 25 during vertical movement of the type bar.

Figure 2:
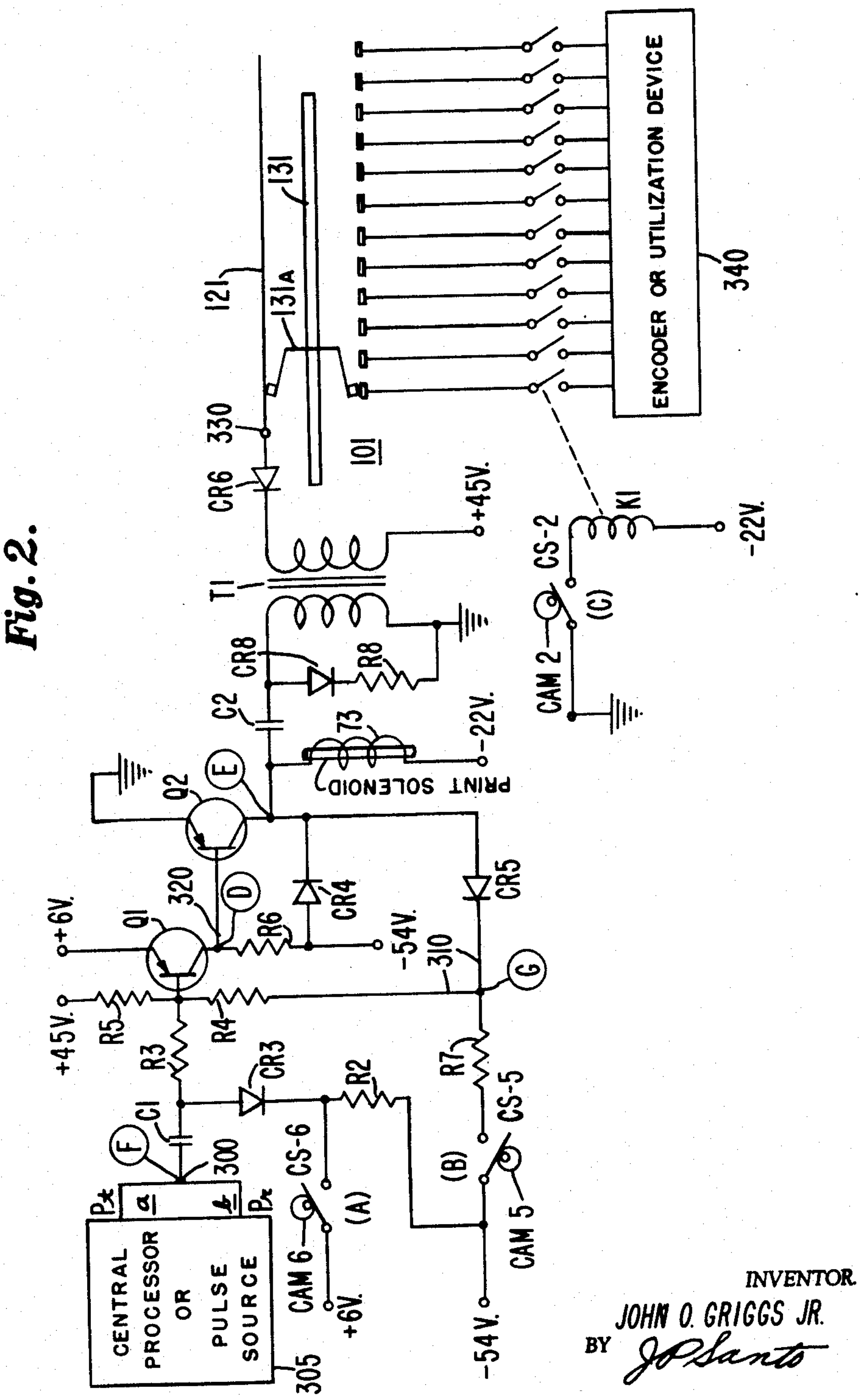
FIG. 2 is an electrical schematic diagram of the dual operating mode pulse switching and current driver circuit of the present invention.

At about 193 degrees of the printer cycle, Cam 2 closes contacts CS–2 to energize the control relay K1 in FIG. 2 to permit the positioned read-out switches to be pulsed. After the type bar has been arrested and at about 219 degrees of the printer cycle, Cam 5 opens cam operated timing control switch CS–5 in the control circuit to permit it to be operated as a current driver for one or more pulses supplied from the processor or signal source to be applied through the control circuit to the positioned read-out switch connected to a print checking or other utilization device which indicates whether or not each type bar stopped at the character it was supposed to print or the selected type that has been printed. With further movement of the cams, the contacts of CS–2 and CS–6 open at about 259 degrees of the printer cycle, and the type bars and control circuit are reset for the next cycle of operation.

Turning now to the description of the control circuit of the present invention, the control circuit comprises a cascaded pair of direct coupled signal translating or amplifying devices shown as junction transistors Q1 and Q2 of similar conductivity type each connected in a common emitter configuration. Q1 is a medium gain, medium voltage PNP transistor such as of the 2N404 variety, while Q2 is a high gain, high voltage PNP power transistor such as of the 2N1138A variety.

Serially connected between the input terminal 300 of the control circuit and the base electrode of Q1 is a signal coupling capacitor C1 and resistor R3, and connected to the junction of C1 and R3 is a germanium diode CR3 and the previously mentioned Cam 6 operated switch CS–6 connected to a +6 volt supply source. Another resistor R2 connected from a —54 volt supply to the cathode of diode CR3 forms a voltage divider network with CR3, R3, and a leak resistor R5 connected to a +45 volt supply. Connected to the base of Q1 is one side of another resistor R4 the other side of which is connected through a silicon diode CR5 to the collector electrode of Q2 to form a feedback path 310 therebetween, the collector electrode of Q1 being connected directly to the base of Q2 over direct coupling connection 320. The emitter of Q1 is connected to the +6 volt supply and its collector to the —54 volt supply through a resistor R6.

The emitter of Q2 is grounded and its collector connected through a clamp diode CR4 to the —54 volt supply to prevent the collector potential from falling below —54 volts. Connected to the junction of R4 and the cathode of CR5 is one side of a resistor R7 the other side of which is connected through Cam 5 operated switch contacts CS–5 to the —54 volt supply to enable the feedback circuit as will be later described. Connected between a —22 volt supply and the collector electrode of Q2 is the print solenoid 73 for one of the type bars 17 of FIG. 1, each of which has a separate control circuit of the character shown in FIG. 2 provided therefor.

Connected between the output or collector electrode of Q2 and the output terminal 330 of the control circuit is a coupling and pulse-tranformer network comprised of components C2, T1, CR8, R8 and CR6 as shown.

The common terminal 121 of the read-out switch 101 controlled by the corresponding control circuit provided therefor is shown connected to the output terminal 330 of the control circuit. The twelve data output terminals of the read-out switch are shown connected to the input terminals of an encoder or utilization device 340 through the contacts of the read-cut control relay K1, which is connected to the —22 volt supply through the contacts CS–2 operated by Cam 2. The encoder or utilization device 340 is not described as it forms no part of the present invention, but in its simplest form could be a series of indicating lamp devices corresponding to the type elements of the positions or numbers of type bar and selectively activated by the read-out pulse transmitted through the completed data output contact of the positioned read-out switch to indicate the character that has been printed. The signal input to the control circuit is supplied from an input signal pulse source 305, which may be the central processor and decoder device utilized with the subject printer or signal pulse source or sources adapted to provide a negative signal pulse $p_t$ on line *a* of 5 to 7 microseconds duration and one or more separated negative pulses $p_r$ each of about 20 microseconds duration on line *b*.

Figure 3:
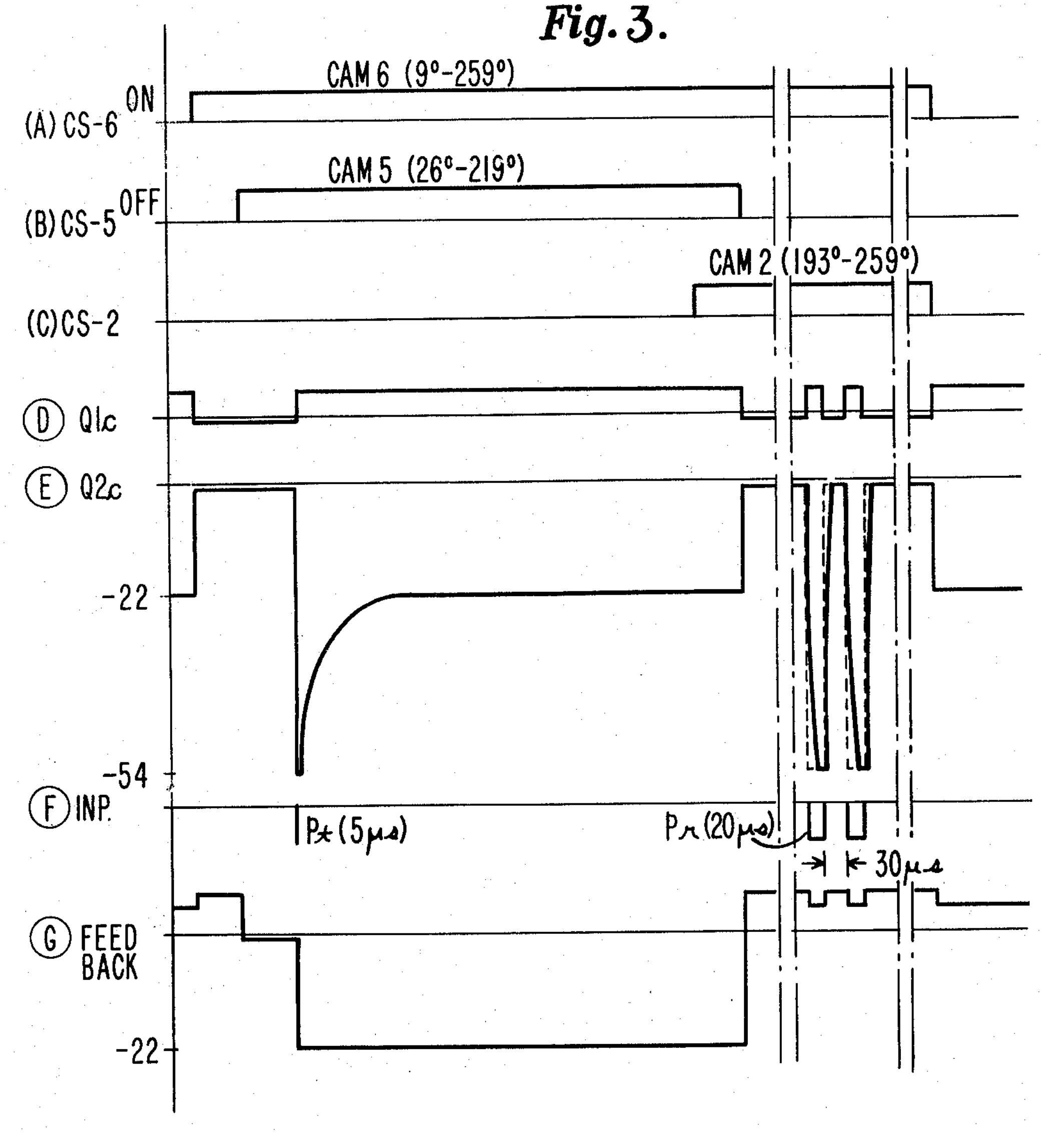
FIGS. 3A to 3G are diagrammatic representations of operations and electrical signals appearing at correspondingly designated points in the circuit of FIG. 2.

Turning now to the description of the operation of the control circuit of FIG. 2 in which the approximating voltages and waveforms for the points corresponding to the bracketed and circled letters on FIG. 2 are shown in FIG. 3, when the printer is at home position, the switches operated by Cams 2, 5 and 6 are open. Q1 is conducting and driven into saturation as a result of the base bias established by the voltage divider R2, CR3, R3, and R5 from —54 v., R5 being greater than R3 and R2. The +6 v. supply connected to the emitter of Q1 elevates the base of Q2 to the collector potential of Q1 approximately +5.7 v., thereby back biasing Q2 and rendering it non-conducting. With Q2 cut off, no current flows through the print solenoid 73 connected between the collector of Q2 and the —22 v. supply, and the collector of Q2 will be at —22 v. With Cam 5 operated switch CS–5 open, the diode CR5, which is connected in the feedback circuit between the collector of Q2 and the base of Q1, will be back biased by the positive potential at the base of Q1, which is approximately +5.8 v., and no current will flow through the feedback path.

At seven milli-seconds or nine degrees of the print cycle, Cam 6 operated switch CS–6 closes to connect +6 v. to the cathode of CR3 and shift the potential level of this point of the divider R3 and R5 to +6 v., resulting in a rise in the base voltage of Q1 to above 6 v., thereby rendering Q1 non-conductive. The collector of Q1 is connected through R6 to —54 v. which drives Q2 into saturation as the collector potential of Q1 drops below ground to a quiescent voltage level of approximately —0.5 v. established by the emitter-base drop of Q2. With Q2 conducting, its collector potential will be approximately 0.2 v. below ground allowing current to flow in the print solenoid to permit full retraction of the stop latches 35 out of the path of the type bar. With Cam 5 operated switch CS–5 still open, diode CR5 in the feedback path will still be back-biased by the positive potential at the base of Q1, and no current will flow in the feedback path. The circuit is still operating as a two-stage class C amplifier and is unsusceptible to being triggered by noise signals in view of the transistor storage time delay and the lack of feedback.

After 20 milli-seconds or at about 26 degrees of the printer cycle, Cam 5 operated switch CS–5 will close to connect —54 v. through R7 to the cathode of CR5 decreasing the potential at this point below the —0.2 v. level of the collector of Q2, thereby forward biasing CR5 and enabling the feedback path 310. The circuit now takes on the configuration of and operates as an unsymmetrical bistable multi-vibrator binary or flip flop device by reason of the direct coupling of the collector to base of Q2 to Q1 and of Q1 to Q2.

Thus, upon the application of a negative triggering pulse *pt* to the base Q1 starting it to conduct, its collector potential rises above ground to switch off Q2 and interrupt the current flow through the print solenoid. As Q2 cuts off, its collector potential drops toward the −54 v. supply and settles to a quiescent level of the −22 v. print solenoid supply. The −22 v. supply of the de-energized print solenoid is transferred across the diode CR5, which is now forwardly biased from the −54 v. supply through R7 and Cam 5 operated switch CS–5, and appears at the cathode of CR5 in the feedback path to forward bias the emitter-base junction of Q1. The feedback voltage is of such sense as to aid or enforce the low level negative triggering pulse, which turned Q1 on, and to keep Q1 conducting after the disappearance of the triggering pulse, thus characterizing the feedback as regenerative in distinction to degenerative feedback that would oppose any disturbing influences from changing the equilibrium or state of the circuit. The regenerative feedback thus aids in switching the circuit, the speed of response of which is further increased by the direct coupling connection between the collector of Q1 to the base of Q2 that enables the stored base charge of Q2 to be swept directly from the +6 v. supply through the collector of Q1. The positive voltage on the emitter of Q1 supplied through Q1 and the direct coupling connection 320 between the stages to the negatively polarized base of previously saturated transistor Q2 rapidly removes the stored charges thereon and eliminates the need for the commonly employed speed-up intercoupling networks. With Q2 cut off, the solenoid current is interrupted to release the stop latch to stop the type bar. All of the type bars will have been stopped between 30 and 150 milli-seconds of the printer cycle.

At 150 milli-seconds or at about 193 degrees of the printer cycle, Cam 2 operates CS–2 to close and energize read-out relay K1 from the −22 v. supply to close its contacts and enable the positioned read-out switch to be pulsed. Then after 170 milli-seconds or at about 219 degrees of the printer cycle, Cam 5 causes CS–5 to open and convert the circuit back to a two stage class C amplifier configuration in which condition it can then operate as a current driver for amplifying and translating a low-level, low energy input pulse to a high level, high energy output pulse supplied to the read-out switches. The opening of biasing switch CS–5 removes the −54 v. supply from the cathode of CR5, which becomes reverse biased from the positive potential at the base of Q1 and, accordingly, disables the feedback path from Q2 to Q1. Cam 6 operated switch CS-6 is still closed supplying +6 v. to the cathode of CR3 resulting in a voltage shift at the base of Q1 above the +6 v. emitter potential thereof, thereby turning Q1 off and Q2 back on again.

With Q2 turned on, current will again flow through the print solenoid 73, although the magnetic strength of the coil is insufficient to restore the positioned stop latch thereof which is mechanically withdrawn or restored later in the cycle of operation of the printer. The energization of the solenoid coil permits energy to be stored therein and later to be released therefrom and applied through voltage step-up transformer T1 for high voltage pulsing of the contacts of the read-out switches when a low level pulse is supplied to the input of the driver circuit. During the printer cycle after the type bar has been set and after Cam 5 operated switch CS–5 has opened and Cam 2 operated switch CS–2 has closed, the read-out switch assembly which has been differentially positioned by its type bar, is pulsed by the application to the input terminal F of FIG. 2 of one or more negative pulses of approximately −7 v. level, twenty micro-seconds in duration shown in FIG. 3 on an expanded time scale, to release the inductive surge energy of the solenoid and derive one or more higher level, high energy pulses supplied through the step-up transformer T1 for application to the contacts of the read-out switch. In the computer system in which the printer of FIG. 1 is employed, two such pulses are employed spaced 30 micro-seconds apart with the second serving as a repeat or checking pulse for the first in the event that electrical contact bounce or contact contamination should prevent the first pulse from being transferred through the electrical contacts of the read-out switch.

With Q1 off and Q2 on, the negative-going low level input pulse is transferred through input coupling capacitor C1 shifting the voltage level at the base of Q1 below its emitter potential to turn Q1 on and drive it to saturation and turn Q2 off. Without the feedback, the pulses are sent directly through Q1 and Q2 with only the usual transistor delay, the pulse duration being chosen to be greater than that of the transistor response. Turning off Q2, attempts to de-energize the print solenoid which has a substantial inductance and induces a high level negative going surge voltage of approximately one milli-second duration that appears on the output conductor connected to the collector of Q2. In order to prevent this voltage from damaging transistor Q2, its collector is clamped to −54 v. through diode CR4 which prevents the collector voltage from dropping below −54 v. The energy stored in the field of the print solenoid 73 is proportional to the product of its inductance and the square of the current therethrough and will be many times greater than that available from the triggering input pulse or pulses that serve to release the energy stored in the print solenoid for application to the read-out switches through coupling capacitor C2 and step up voltage transformer T1.

After the pulses of FIG. 3E are stepped up through transformer T1 and supplied to the corresponding read-out switch, and through the now closed contacts of relay K112, applied to the encoder and pulse checking circuit or the utilization device, the contacts of CS–2 and CS–6 are opened by their respective cams at about 259 degrees of the printer cycle, restoring the control circuit back to its original condition for an ensuing cycle of operation of the printer.

What is claimed is:

1. In combination, a cascaded pair of direct coupled signal amplifying devices having input and output terminals including a signal input connection to the input of the first device, a load and a source of operating potential therefor connected to the output terminal of the second device, a selectively enabled regenerative feedback connection from the output of the second device to the input of the first device, means biasing the first device off and the second device on, means enabling the feedback connection when the second device is on to aid in switching the load from one side of said source to the other under the application to the signal input connection of an input pulse biasing said first amplifying device on and to maintain the switched condition of the load after the disappearance of the signal input pulse, and means disabling the feedback connection after the load has been switched by said input pulse to restore said signal amplifying devices back to their originally mentioned states for operation as a current driver for a subsequent pulse applied to said input circuit connection.

2. A circuit combination comprising a pair of alternately conducting transistors of similar conductivity type each having an emitter electrode, collector electrode and base electrode, a first circuit path interconnecting the collector electrode of the first transistor and the base electrode of the second, a second circuit path interconnecting the collector electrode of the second transistor and the base electrode of the first transistor, a signal input circuit connected to the base electrode of the first transistor and a load circuit including a source of operating potential therefor connected between the collector electrode and the emitter electrode of the second transistor, means to reverse bias the internal emitter base path of the first transistor and render it non-conducting and the second transistor conducting, said second circuit path including a diode poled to present a high impedance to direct current of the polarity reverse-biasing the internal emitter-base path of the first transistor, and means to bias the diode in the forward direction to aid the switching of the load from one side of said source to the other under the application to the signal input circuit of a signal pulse forward biasing the internal emitter-base path of the first transistor and to maintain the switched condition of the load after the disappearance of the signal pulse.

3. The combination in accordance with claim 2 above wherein the means to bias the diode is selectively applicable, whereby in the presence of the bias, the circuit is operative as a bistable binary, and in the absence of the bias, as a two stage current driver.

4. A transistor circuit combination comprising a cascaded pair of alternately conducting transistors of similar conductivity type each having an emitter electrode, collector electrode and base electrode and connected in a common-emitter circuit configuration, a D.C. path interconnecting the collector electrode of the first transistor and the base electrode of the second, means to reverse bias the internal emitter base path of the first transistor and render it non-conducting and the second transistor conducting, a regenerative feedback circuit including a diode between the collector electrode of the second transistor and the base electrode of the first transistor and poled to present a high impedance to direct current of the polarity reverse-biasing the internal emitter-base path of the first transistor, a signal input circuit connected to the base electrode of the first transistor and a load circuit including a source of operating potential therefor connected between the collector electrode and the emitter electrode of the second transistor, selectively enabled biasing means to bias said diode in the forward direction and enable said regenerative feedback circuit to aid the switching of the load from one side of said source to the other under the application to the signal input circuit of a signal pulse forward biasing the internal emitter-base path of the first transistor and to maintain the switched condition of the load after the disappearance of the signal pulse, and means for disabling said last named biasing means to disable said feedback circuit and restore said transistors back to their original states after said load has been switched by said input pulse, thereby to permit said transistor circuit combination to operate as a current driver for a subsequent input pulse applied thereto.

5. For a printing device including a differentially positionable type bar, means for moving the bar, selectively operable arresting means including a solenoid coil operable to arrest the movement of the bar, and a multiple position electrical contact read-out switch device coupled to and positioned with the type bar to complete an input circuit to one of a plurality of data output circuits representing different positions of the type bar in accordance with the arrested position thereof; a dual operating mode electrical switching circuit for controlling from low level signal pulses applied thereto both the arresting operation of the type bar and a high level pulsing of the contacts of the read-out switch utilizing the electrical energy stored in the solenoid coil, comprising, a pair of alternately conducting signal translating devices having input and output terminals including a signal input connection to the input terminal of the first device for application of said pulses thereto, means connecting the output terminal of the first device to the input terminal of the second device, a source of operating potential in series with said solenoid coil connected to the output terminal of the second device, means coupling the output terminal of the second device to the input circuit of said read-out switch, a selectively enabled regenerative feedback connection from the output terminal of the second device to the input of the first, means biasing the first device off and turning the second device on, means enabling the feedback connection when the second device is on to de-energize said solenoid coil under the application to the signal input connection of a low level signal input pulse biasing said first device on and to maintain the de-energized condition of said solenoid coil after the disappearance of the signal input pulse, and means disabling the feedback connection after said solenoid coil has been de-energized by said input pulse to restore said signal translating devices back to their originally mentioned states and to re-energize the solenoid coil and store energy in the field thereof from said source of operating potential for release to pulse the contacts of the read-out switch upon the application of a subsequent switching pulse to said signal input connection while said feedback connection is disabled.

6. For a cyclically operable printing device including a differentially positionable type bar, means for moving the bar, selectively operable arresting means including a solenoid coil operable to arrest the movement of the bar, and a multiple position electrical contact read-out switch device coupled to and positioned by the type bar to complete an input circuit to one of a plurality of data output circuits representing different positions of the type bar in accordance with the arrested position thereof; a dual operating mode electrical switching circuit for effecting from low level signal pulses applied thereto both the arresting operation of the type bar and a high level pulsing of the contacts of the read-out switch during the cyclical operation of the printing device comprising, a pair of cascaded signal amplifying devices having input and output terminals including a signal input connection to the input terminal of the first device for application of low level input pulses thereto, means connecting the output terminal of the first device to the input terminal of the second amplifying device, a source of operating potential in series with said solenoid coil connected to the output terminal of the second amplifying device, means coupling the output terminal of the second amplifying device to the input circuit of said read-out switch, means operable during the cyclical operation of the printing device to bias the first amplifying device off and turn the second amplifying device on, a selectively enabled regenerative feedback connection from the output terminal of the second amplifying device to the terminal input of the first amplifying device, and means operable during the cycle of operation of the printing device enabling the feedback connection when the first amplifying device has been turned off by said first-mentioned biasing means and conditioned for receipt of a signal input pulse thereto, said last mentioned means subsequently operating during the cyclical operation of the printing device disabling the feedback connection after the receipt of said signal input pulse and permitting re-energization of the solenoid coil for storage of energy in the field thereof from said source of operating potential for release to pulse the contacts of the read-out switch upon the application of a subsequent switching pulse to said signal input connection while said feedback connection is disabled and said first mentioned biasing means is enabled.

7. A switching circuit in accordance with claim 6 above including means operating still later during the cyclical operation of th printing device and after the feedback connection has been disabled and the read-out switch has been pulsed for disabling the first mentioned biasing means.

8. For a cyclically operable printing device including a differentially positionable type bar, means for moving the bar, selectively operable arresting means including a solenoid coil operable to arrest the movement of the bar, and a multiple position electrical contact read-out switch device coupled to and positioned by the type bar to complete an input circuit to one of a plurality of data output circuits representing different positions of the type bar in accordance with the arrested position thereof; a dual operating mode electrical switching circuit for controlling from low level signal pulses applied thereto both the arresting operation of the type bar and the high level pulsing of the contacts of the read-out switch, comprising, a cascaded pair of alternately conducting transistors of similar conductivity type each having an emitter electrode, collector electrode and base electrode, a signal input connection to the base electrode of the first transistor a D.C. coupling between the collector electrode of the first transsistor and the base electrode of the second, a source of operating potential and said solenoid coil connected in series between the collector electrode and the emitter electrode of the second transistor, means coupling the collector electrode of the second transistor to the input circuit of the readout switch, means to reverse bias the internal emitter-base path of the first transistor and render it non-conducting and the second transistor conducting, a regenerative feedback circuit including a diode between the collector electrode of the second transistor and the base electrode of the first transistor and poled to present a high impedance to direct current of the polarity reverse-biasing the internal emitter base path of the first transistor, selectively enabled biasing means to bias said diode in the forward direction and enable said regenerative feedback circuit when the second transistor is on, means disabling said last named biasing means to disable said feedback circuit after the application to the signal input connection of an input pulse forward biasing the internal emitter-base path of the first transistor, and means disabling said transistor reverse biasing means after said diode forward biasing means has been disabled and the application of a subsequent pulse to the signal input connection for pulsing of the read-out switch.

9. A pulse switching circuit combination comprising a pair of alternately conducting transistors of similar conductivity type each having an emitter electrode, collector electrode and base electrode and connected in a common emitter circuit configuration with the emitter of the first transistor connected to a reference potential source of opposite polarity to the polarity of the base of the second transistor and of a higher potential level than that of the emitter of the second transistor, a first circuit path directly coupling the collector electrode of the first transistor and the base electrode of the second, a second circuit path interconnecting the collector electrode of the second transistor and the base electrode of the first transistor, a signal input circuit connected to the base electrode of the first transistor and a load circuit including a source of operating potential therefor connected between the collector electrode and the emitter electrode of the second transistor, means to reverse bias the internal emitter base path of the first transistor and render it nonconducting and to forward bias the second transistor and place it in a conducting saturated condition, said second circuit path including a diode poled to present a high impedance to direct current of the polarity reverse-biasing the internal emitter-base path of the first transistor, and means to bias the diode in the forward direction to aid the switching of the load from one side of said source to the other under the application to the signal input circuit of a signal pulse forward biasing the internal emitter-base path of the first transistor and to maintain the switched condition of the load after the disappearance of the signal pulse.

10. A pulse switching circuit combination comprising a pair of alternately conducting transistors of similar conductivity type each having an emitter electrode, collector electrode and base electrode and connected in a common emitter configuration with the collector electrode of the first transistor directly connected to the base electrode of the second transistor, a signal input circuit connected to the base electrode of the first transistor, a load and source of operating potential therefor connected between collector electrode and the emitter electrode of the second transistor, means to reverse bias the internal emitter-base path of the first transistor and render it non-conducting and to forward bias the second transistor conducting into saturation, and a reference source of potential connected to the emitter electrode of the first transistor and of opposite polarity to that of the base electrode of the second transistor and of a greater potential level than that of the emitter of the second transistor to sweep the stored base charge of the second transistor directly from the emitter supply of and through the first transistor and direct connection between said transistors upon the application of a switching pulse to said signal input circuit.

11. A cascaded, D.C. coupled pair of PNP junction transistors each having an emitter, collector and base electrode connected in a common emitter configuration with operating and biasing potential sources therefor to place them in opposite conducting states adapted to be reversed upon application of a switching pulse to the base electrode of the first transistor, the emitter electrode of the second transistor being grounded and that of the first transistor having a positive potential source connected thereto for supplying the emitter operating potential therefor and sweeping the stored base charge of the second transistor directly from and through the first transistor.

12. In combination, a pair of alternately conducting switching devices having input and output terminals including a signal input connection to the input terminal of the first device, a direct connection between the output terminal of the first device and the input terminal of the second device, a load and a source of operating potential therefor connected to the output terminal of the second device, a regenerative feed-back connection from the output terminal of the second device to the input terminal of the first device to aid in switching the load from one side of said source to the other under the application to the signal input connection of a signal input pulse reversing the condition of said switching devices and to maintain the switched condition of the load after the disappearance of the signal input pulse, and means for disabling the feed-back connection to restore said switching devices back to the condition occupied thereby prior to the switching thereof by said signal input pulse.

13. In combination, a pair of alternately conducting switching devices having input and output terminals including a signal input connection to the input terminal of the first device, means connecting the output terminal of the first device to the input terminal of the second device, a load and a source of operating potential therefor connected to the output terminal of the second device, means biasing the first device off and the second device on, a selectively conditionable circuit establishing a regenerative feed-back circuit path from the output terminal of the second device to the input terminal of the first device, and feed-back circuit conditioning means operable to enable said feed-back circuit path to aid in switching the load from one side of said source to the other under the application to the signal input connection of an input pulse momentarily biasing said first switching device on and to maintain the switched condition of the load after the disappearance of the signal input pulse, said feed-back circuit conditioning means also operable to disable the feed-back circuit path to restore said switching devices back to their originally mentioned states if the load has been switched by said input pulse.

14. In a system including a differentially positionable type bar, means for moving the bar, selectively operable arresting means including a solenoid coil and mechanical stop means positionable thereby into the path of movement of the bar, and a multiple position electrical contact switch device positionable with the type bar to complete a circuit from an input contact of the switch through one of a plurality of data output contacts representing different positions of the type bar in accordance with the arrested position thereof; means for controlling the solenoid to arrest the type bar and to pulse the contacts of the switch, said control means having an input terminal and an output terminal, a D.C. source of operating potential connected in series with said solenoid coil to the output terminal of said control means, and A.C. coupling means coupling the output terminal of said control means to said input contact of said switch, said control means having a switching section connected between the input and output terminals thereof and normally establishing a D.C. current flow path through said solenoid coil from said source, said switching section operable upon application of a low level control pulse to the input terminal of said control means to interrupt the current flow from said source through said coil and thereby to release said stop means into the path of movement of the type bar and to release the energy stored in the coil through said A.C. coupling means and supply a high level, high energy, contact decontaminating wetting pulse through the positioned contacts of the switch.

References Cited in the file of this patent

UNITED STATES PATENTS

| | | |
|---|---|---|
| 2,913,599 | Benton | Nov. 17, 1959 |
| 3,062,134 | Deighton | Nov. 6, 1962 |
| 3,109,125 | Wachowiak | Oct. 29, 1963 |